(12) United States Patent
Matsuyama et al.

(10) Patent No.: US 6,384,894 B2
(45) Date of Patent: May 7, 2002

(54) DEVELOPING METHOD AND DEVELOPING UNIT

(75) Inventors: Yuji Matsuyama; Shuichi Nagamine, both of Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/761,741

(22) Filed: Jan. 18, 2001

(30) Foreign Application Priority Data

Jan. 21, 2000 (JP) ......................................... 2000-017796

(51) Int. Cl.⁷ ......................... G03B 27/32; G03B 27/52; G03B 27/30; G03D 5/00; G03C 5/00
(52) U.S. Cl. ........................... 355/27; 355/30; 355/72; 355/77; 355/100; 396/611; 396/626; 396/627; 430/311; 430/312; 430/322; 430/323; 430/325
(58) Field of Search ............................. 355/27, 30, 72, 355/77, 100; 396/627, 626, 611; 430/311, 312, 322, 323, 325

(56) References Cited

U.S. PATENT DOCUMENTS

| | | | |
|---|---|---|---|
| 4,410,562 A | * 10/1983 | Nemoto et al. | 427/54.1 |
| 4,633,804 A | * 1/1987 | Arii | 118/52 |
| 5,753,415 A | * 5/1998 | Tamura | 430/311 |
| 5,830,623 A | * 11/1998 | Maruyama et al. | 430/322 |
| 5,854,953 A | 12/1998 | Semba | |
| 5,893,004 A | * 4/1999 | Yamamura | 396/611 |
| 5,919,520 A | 7/1999 | Tateyama et al. | |
| 6,230,722 B1 | * 5/2001 | Mitsumori et al. | 134/122 |

* cited by examiner

Primary Examiner—Russell Adams
Assistant Examiner—Khaled Brown
(74) Attorney, Agent, or Firm—Rader, Fishman & Grauer, PLLC

(57) ABSTRACT

The present invention is a method for developing a substrate by supplying a developing solution from a developing solution supply nozzle onto a surface of the substrate mounted on a predetermined position, and comprises the steps of moving the developing solution supply nozzle from a standby position of the developing solution supply nozzle outside one end of the substrate to at least the other end of the substrate without supplying the developing solution, and thereafter, moving the developing solution supply nozzle from the other end to at least the one end while supplying the developing solution. Therefore, the developing solution supply nozzle which is used once and has a possibility of a drip of the developing solution does not pass above the substrate, so that the developing solution never drips from the developing solution supply nozzle onto the substrate before and after supplying the developing solution for some reason or other. Therefore, developing defect due to the drip of the developing solution can be prevented.

11 Claims, 19 Drawing Sheets

DEVELOPING METHOD AND DEVELOPING UNIT

BACKGROUND OF THE INVENTION

1. Field of the Invention

This invention relates to a developing method and a developing unit of a substrate.

2. Description of the Related Art

In a process of photolithography in a fabricating process of a semiconductor device, for example, a resist solution is coated onto a surface of a wafer, and a resist coating for forming a resist film, an exposure for exposing the wafer according to a pattern, a developing for developing the exposed wafer and so on are operated to form a predetermined circuit pattern on the wafer.

In the developing for developing the wafer as described above, a method for supplying a developing solution with a developing solution supply nozzle which is in a slimline shape and is provided with a plurality of supplying holes of the developing solution scanning above the wafer is often used.

In this method, the wafer is first mounted on a mounting table, and the developing solution supply nozzle which is on standby at a home position (standby position) outside one end of the wafer scans above the wafer while supplying the developing solution, and stops supplying the developing solution when the developing solution supply nozzle moves to the other end of the wafer, so that the developing solution is supplied onto an entire surface of the wafer. Thereafter, the developing solution supply nozzle is returned back to a standby position, that is, the home position from the other end of the wafer by passing above the wafer. The developing solution supply nozzle always returns to the home position because a washing mechanism for washing the developing solution supply nozzle is provided at the home position outside one end of the wafer.

Then, after a predetermined time is passed and the developing is complete, pure water is supplied onto the wafer to wash the developing solution from the wafer W.

However, in the aforementioned developing method, the developing solution supply nozzle passes above the wafer again after the developing solution is supplied onto the wafer, and hence there is a possibility that the developing solution drips from the developing solution supply nozzle onto the wafer. If the developing solution is dripped onto the wafer, the developing solution of this dripped spot contains a different concentration, and further, there is apprehension that dirt which is attached to the developing solution supply nozzle may be included therein when dripping, which may result in developing defect, line width defect, shape failure of the wafer and so on.

Moreover, if pure water is supplied onto the wafer immediately after a predetermined time is passed to complete the developing, so-called pH shock which is occurred in supplying a liquid of a large difference in pH value may occur to generate an impurity. This may result in developing defect.

SUMMARY OF THE INVENTION

The present invention is made in view of these points, and its first object is to provide a developing method for preventing a mistaken drip of a developing solution onto a wafer which is already supplied with the developing solution and a developing unit provided with a function therefor, in a developing method for supplying the developing solution onto the wafer while scanning.

A second object of the present invention is to prevent an occurrence of so-called pH shock in the developing.

In view of the aforementioned first object, according to a first aspect of the present invention, the present invention is a method for developing a substrate by supplying the developing solution from a developing solution supply nozzle onto a surface of the substrate mounted on a predetermined position, comprising the steps of: moving the developing solution supply nozzle from a standby position of the developing solution supply nozzle outside one end of the substrate to at least the other end of the substrate without supplying the developing solution, and moving the developing solution supply nozzle thereafter from the other end to at least the one end while supplying the developing solution.

Thereby, the developing solution is not supplied when the developing solution supply nozzle moves from the standby position of the substrate to the other end of the substrate, and the developing solution is supplied when it moves from the other end of the substrate to the standby position, so that the developing solution supply nozzle which is used once and has a possibility of the drip of the developing solution never passes above the substrate. Therefore, it is prevented that, because of the developing solution which is mistakenly dripped from the developing solution supply nozzle onto the wafer before and after supplying the developing solution, this dripped spot contains a different concentration of the developing solution, or the dripped developing solution including dirt and the like adheres to the substrate, which eliminates the possibility of developing defect and so on.

According to a second aspect of the present invention, the present invention is the method for developing the substrate by supplying the developing solution from the developing solution supply nozzle onto the surface of the substrate mounted on the predetermined position, comprising the step of: mounting the substrate on the predetermined position, between the steps of moving the developing solution supply nozzle from the standby position of the developing solution supply nozzle outside the predetermined position to at least the other end of the substrate without supplying the developing solution, and moving the developing solution supply nozzle from at least the other end to at least one end while supplying the developing solution.

Thus, the step of mounting the substrate on the predetermined position is included between the aforementioned steps so that the substrate is carried into a process unit after the developing solution supply nozzle moves to the other end of the substrate, and hence the developing solution supply nozzle never passes above the wafer except when supplying the developing solution. Therefore, the possibility that the developing solution is mistakenly dripped from the developing solution supply nozzle onto the wafer is completely eliminated.

According to a third aspect of the present invention, the present invention is the method for developing the substrate by supplying the developing solution from the developing solution supply nozzle onto the surface of the substrate mounted on the predetermined position, comprising the steps of: moving the developing solution supply nozzle from the standby position of the developing solution supply nozzle outside one end of the substrate to at least the other end of the substrate while supplying pure water, and moving the developing solution supply nozzle thereafter from at least the other end to at least the one end while supplying the developing solution.

Thereby, pure water is supplied when the developing solution supply nozzle moves from the standby position of the substrate to the other end of the substrate, and the developing solution is supplied when it moves from the other end of the substrate to the standby position, so that the developing solution supply nozzle which has the possibility of the drip of the developing solution does not pass above the substrate which is already supplied with the developing solution, in contrast to the conventional art. Therefore, if the developing solution is mistakenly dripped from the developing solution supply nozzle after supplying the developing solution onto the substrate, the dripped developing solution never drips onto the wafer because it does not pass above the substrate. Therefore, it is prevented that, because of the developing solution which is mistakenly dripped from the developing solution supply nozzle onto the wafer after supplying the developing solution, this dripped spot contains the different concentration of the developing solution, or the dripped developing solution including dirt and the like adheres to the substrate. Further, when the developing solution is directly supplied onto the substrate, there is apprehension that developing defect such as partial unevenness of the developing may occur because minute air bubbles which exist in the developing solution and minute air bubbles which is generated when the developing solution adheres to the substrate, but these cases can be prevented by supplying pure water onto the substrate before supplying the developing solution thereon.

According to a fourth aspect of the present invention, the present invention is a developing unit of the substrate for supplying the developing solution onto the substrate with the developing solution supply nozzle moving toward a predetermined direction above the substrate, wherein the developing solution supply nozzle includes a developing solution supply hole for supplying the developing solution and a pure water supply hole for supplying pure water individually along the predetermined direction, and wherein the pure water supply hole is structured to supply pure water when moving to a reverse direction of the predetermined direction, and the pure water supply hole is placed in a forward side of a moving direction in supplying pure water.

Thus, the pure water supply hole and the developing solution supply hole are provided individually, in which the pure water supply hole for supplying pure water while moving toward the reverse direction of the predetermined direction is provided to be placed in the forwarder side of the moving direction than the developing solution supply hole so that the developing solution supply hole always passes above the substrate after pure water is supplied thereon. Thereby, if the developing solution is dripped from the developing solution supply hole, it is dripped onto a pure water film, not onto the substrate directly, and hence developing defect or the like due to the drip of the developing solution is prevented.

According to a fifth aspect of the present invention, the present invention is the developing unit of the substrate for supplying the developing solution onto the substrate with the developing solution supply nozzle moving toward the predetermined direction above the substrate, wherein the developing solution supply nozzle includes the developing solution supply hole for supplying the developing solution and the pure water supply hole for supplying pure water individually along the predetermined direction, and wherein the pure water supply hole is structured to supply pure water when moving to the reverse direction of the predetermined direction, and the pure water supply hole is placed in a backward side of the moving direction in supplying pure water.

Thereby, when the developing solution supply hole supplies the developing solution while moving toward the predetermined direction, the developing solution supply hole is placed in the backward side of the moving direction with respect to the pure water supply hole. Namely, contamination of the other supplying hole by a supplying process solution can be prevented because the supply hole which supplies the process solution is always placed in the rear side of the moving direction.

According to a sixth aspect of the present invention, the present invention is the developing unit of the substrate including the developing solution supply nozzle for moving above the substrate and for supplying the developing solution onto the substrate, comprising: washing tanks for washing the developing solution supply nozzle outside both ends of the substrate, respectively.

This washing tank is not limited to the one which simply stores a washing solution in a tank, but the one which is structured to receive a part of the developing solution supply nozzle for washing it is also included.

Thus, by providing the washing tanks at both sides outside the substrate, a supplying means can be washed every time when the developing solution supply nozzle reaches the respective outer portion at both sides of the substrate, in a case where, for example, the developing solution is supplied onto the substrate by its reciprocating movements above the substrate. Therefore, it is not necessary to return from the other end to one end for washing after, for example, it moves from one end to the other end for supplying the developing solution. That is, after supplying the developing solution, the developing solution supply nozzle is unnecessary to move above the substrate for the washing. Thus, the developing solution supply nozzle having the possibility of dripping the developing solution does not pass above the substrate, so that developing defect or the like due to the drip of the developing solution is prevented.

In view of the second object of the present invention, according to a seventh aspect of the present invention, the present invention is a method for developing the substrate by supplying the developing solution onto an entire surface of the substrate mounted on the predetermined position, comprising the steps of: supplying a developing solution onto the substrate with the lower concentration than that of the aforementioned developing solution, after completion of the developing for a predetermined time after the developing solution is supplied, supplying the developing solution with the lower concentration onto the wafer by gradually decreasing its concentration, and supplying pure water subsequently onto the substrate.

According to an eighth aspect of the present invention, the present invention is the developing unit of the substrate for supplying the developing solution onto the substrate with the developing solution supply nozzle moving toward the predetermined direction above the substrate, wherein the developing solution supply nozzle includes the developing solution supply hole for supplying the developing solution and the pure water supply hole for supplying pure water individually along the predetermined direction, and wherein a supplying amount of the developing solution from the developing solution supply hole and a supplying amount of pure water from the pure water supply hole are adjustable.

According to the ninth aspect of the present invention, the present invention is the developing unit of the substrate for supplying the developing solution onto the substrate with the developing solution supply nozzle moving toward the predetermined direction above the substrate, wherein the developing solution supply nozzle includes the developing solution supply hole for supplying the developing solution and the pure water supply hole for supplying pure water individually along the predetermined direction, and wherein the developing solution supply hole is structured to be able to supply the developing solutions with a plurality of different concentrations.

According to the present invention, there is no possibility of the occurrence of "pH shock" because pure water is not supplied all at once as in the conventional art. Such a process can be operated after a predetermined developing solution on the substrate is cleared off by rotating the substrate after the developing, or the supplying of the developing solution with the low concentration can be started at the same time with the clearing off.

Further, according to the present invention, the developing solution supply hole for supplying the developing solution and the pure water supply hole for supplying pure water are included individually along the predetermined direction, and the supplying amount of the developing solution from the developing solution supply hole and the supplying amount of pure water from the pure water supply hole are adjustable. Thereby, for example, after a predetermined developing, the developing solution is supplied from the developing solution supply hole and pure water is simultaneously supplied from the pure water supply hole so that the developing solution with the low concentration can be supplied onto the substrate, and further, since each of supplying amount is adjustable, the supplying amount of pure water is gradually increased, or the supplying amount of the developing solution is gradually decreased, or both of them are performed to finally supply only pure water, which makes it possible to realize a process in which the developing solution with the low concentration is supplied while gradually decreasing its concentration and finally, only pure water is supplied.

Moreover, according to the present invention, the developing solution supply hole is structured to be able to supply the developing solutions with the plurality of different concentrations, so that, for example, the developing solution with the decreasing concentrations can be supplied in order, and the supplying of the developing solution from the developing solution supply hole can be stopped at last to supply only pure water from the pure water supply hole.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENT

Figure 1:
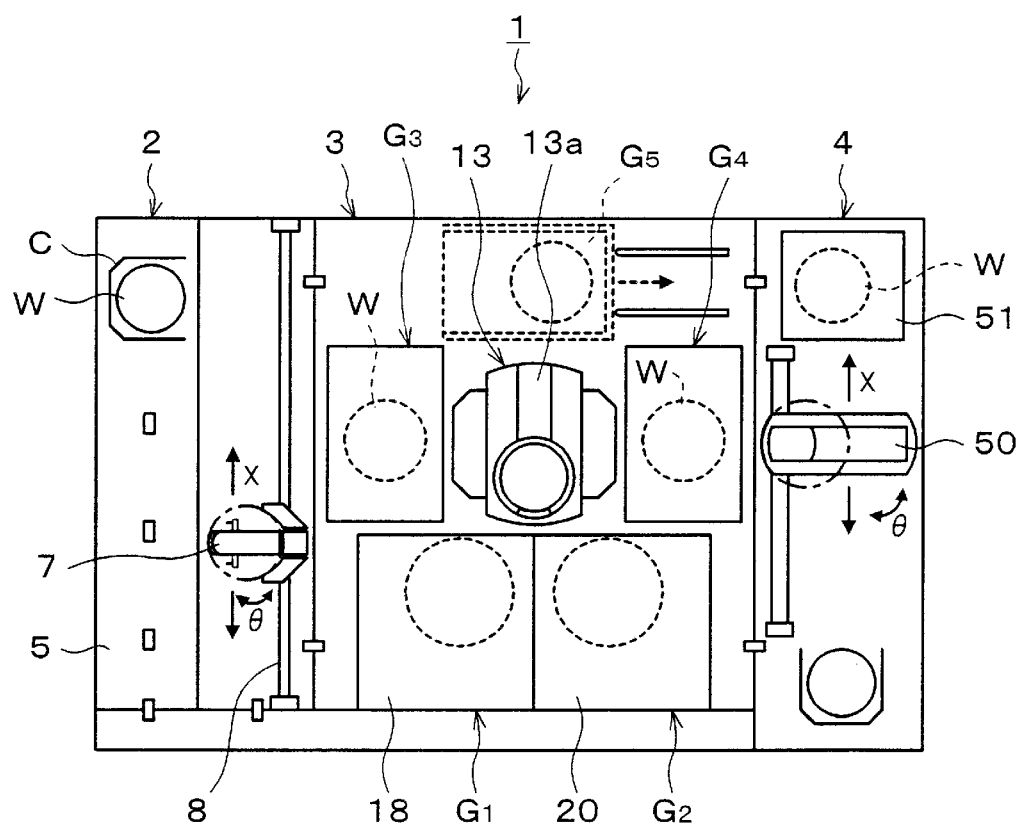
FIG. 1 is a plane view showing an exterior of a coating and developing system having units for operating a developing method according to the embodiment.
Figure 2:
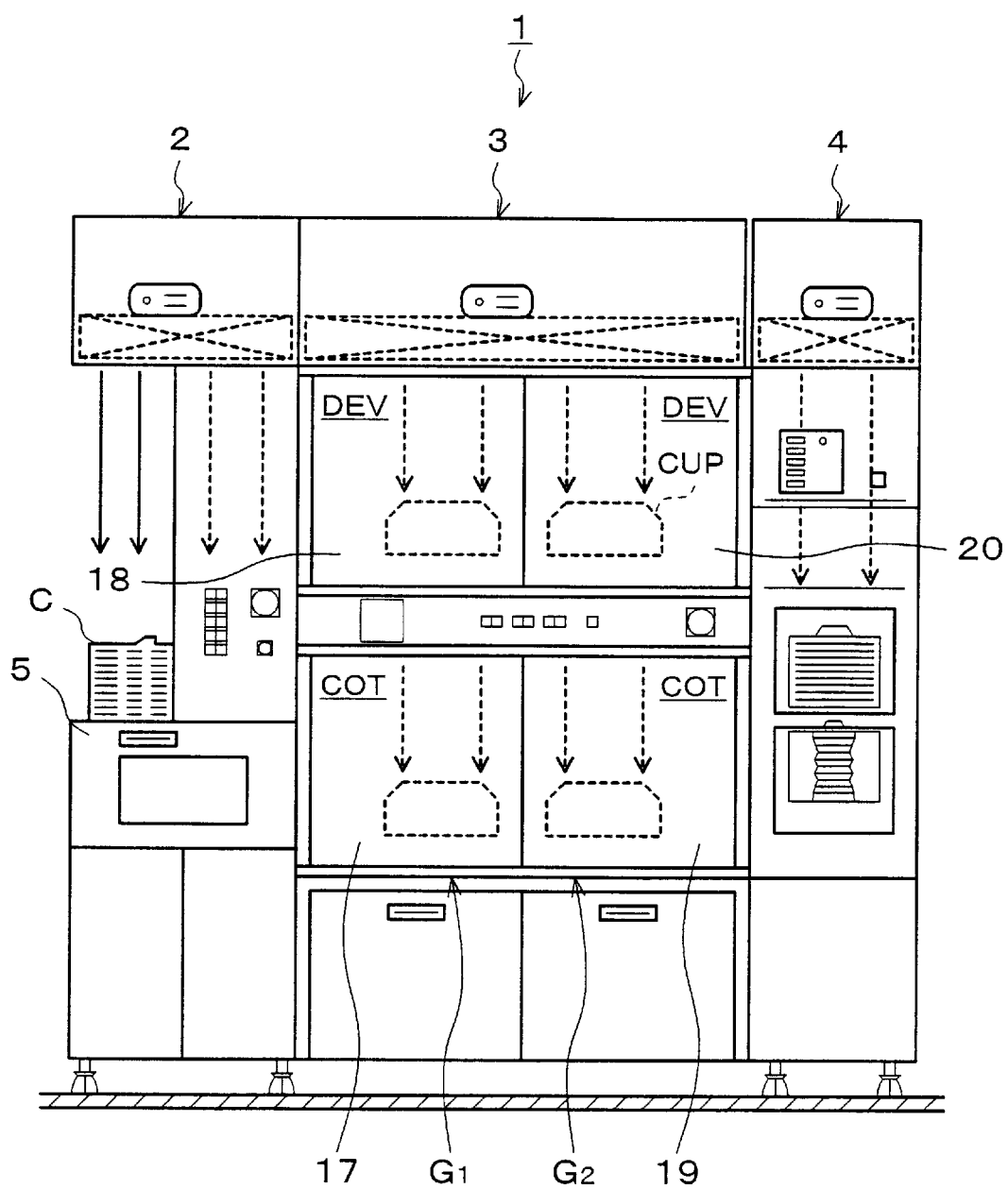
FIG. 2 is a front view of the coating and developing system in FIG. 1.
Figure 3:
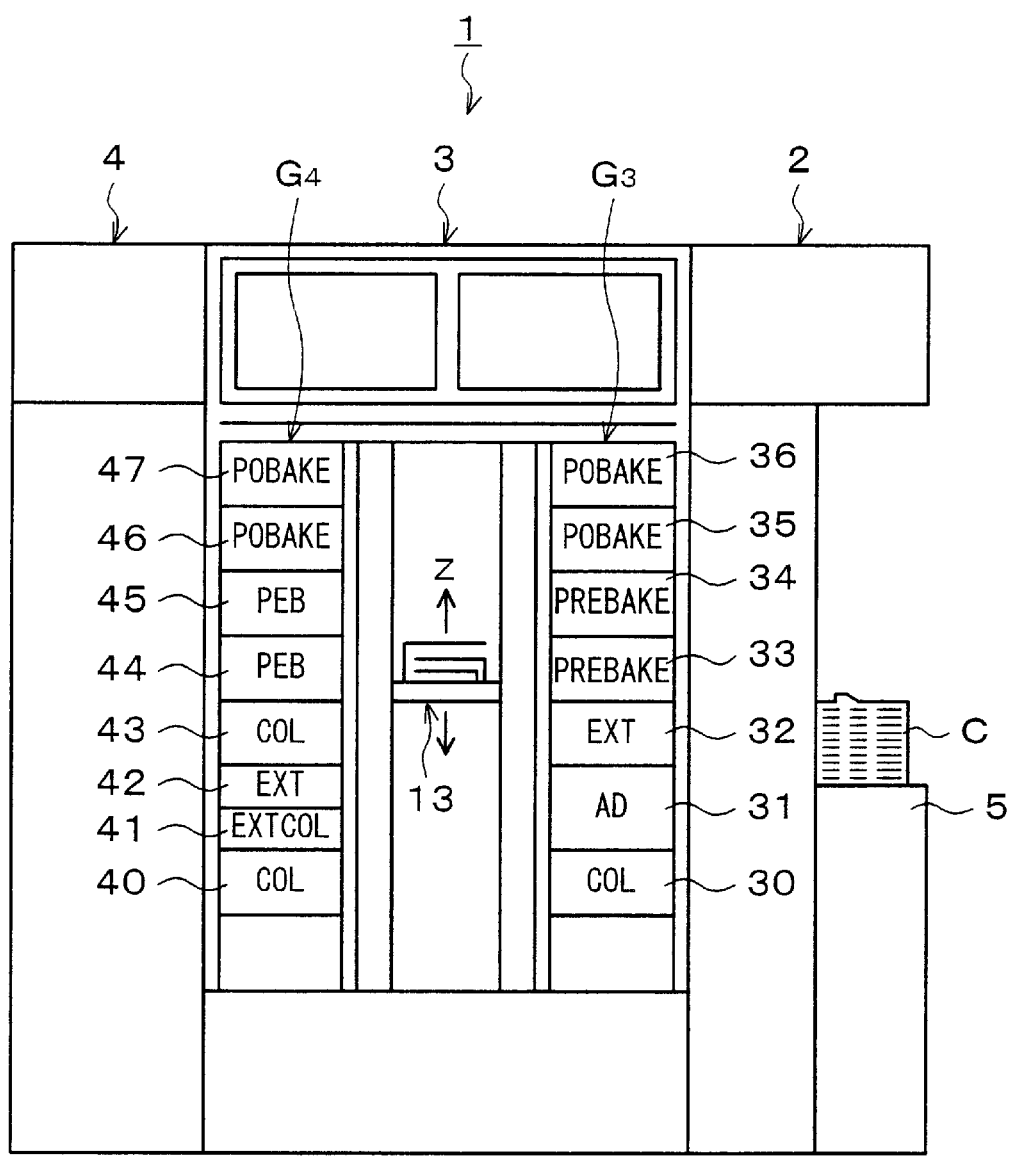
FIG. 3 is a rear view of the coating and developing system in FIG. 1.

Hereinafter, the preferred embodiments of the present invention will be explained. FIG. 1 is a plane view of a coating and developing system 1 having a developing unit which operates a developing method according to this embodiment, FIG. 2 is a front view of the coating and developing system 1, and FIG. 3 is a rear view of the coating and developing system 1.

The coating and developing system 1, as shown in FIG. 1, has a structure in which a cassette station 2 which carries, for example, 25 wafers W in a cassette into/out of the coating and developing system 1 from/to the outside and carries the wafer W into/out of a cassette C, a process station 3 in which various process units are disposed in multiple layers for operating predetermined processes in a single wafer type in a coating and developing process and an interface section 4 which delivers the wafer W from/to a not-shown exposure unit provided next to the process station 3 are integrally connected.

In the cassette station 2, a plurality of cassettes C are freely mounted in an X direction (in a top and bottom direction in FIG. 1) in a line at predetermined positions on a cassette mounting table 5 as a mounting section. Further, a wafer carrier 7 which can be transported to a cassette alignment direction (X direction) and a wafer alignment direction (Z direction; a vertical direction) of the wafer W housed in the cassette C is provided to be movable along a carrier path 8, and is accessible selectively to the respective cassettes C.

The wafer carrier 7 has an alignment function for performing alignment of the wafer W. This wafer carrier 7 is also structured to be accessible to an extension unit 32 which belongs to a third process unit group $G_3$ of the process station 3 side, as will be described later.

In the process station 3, a main carrier unit 13 is provided in its center part, and a carrier arm 13a for holding and carrying the wafer W is attached to the main carrier unit 13. In the periphery around the main carrier unit 13, various process units are provided in multiple layers to compose process unit groups. In this coating and developing system 1, the four process unit groups $G_1$, $G_2$, $G_3$ and $G_4$ are disposed, in which a first and a second process unit groups $G_1$ and $G_2$ are disposed in the front side of the coating and developing system 1, the third process unit group $G_3$ is disposed next to the cassette station 2, and a fourth process unit group $G_4$ is disposed next to the interface section 4. Further, an extra fifth process unit group $G_5$ can be optionally disposed in the rear side, as shown in a broken line. The main carrier unit 13 can carry the wafer W into/out of the later-described various process units which are disposed in the process unit groups $G_1$ to $G_5$.

In the first process unit group $G_1$, for example as shown in FIG. 2, a resist coating unit 17 for coating the wafer W with a resist solution and a developing unit 18 for developing the wafer W are two-tiered from the bottom in order. Similarly in the second process unit group $G_2$, a resist coating unit 19 and a developing unit 20 for operating the developing method according to this embodiment are two-tiered from the bottom in order.

In the third process unit group $G_3$, for example as shown in FIG. 3, a cooling unit 30 for cooling the wafer W, an adhesion unit 31 for enhancing adhesion properties of the resist solution and the wafer W, the extension unit 32 for making the wafer W on standby, prebaking units 33, 34 for drying a solvent in the resist solution, post-baking units 35, 36 for heating the developed wafer W, and the like are, for example, seven-tiered from the bottom in order.

In the fourth process unit group $G_4$, for example, a cooling unit 40, an extension and cooling unit 41 for naturally cooling the mounted wafer W, an extension unit 42, a cooling unit 43, post-exposure baking units 44, 45 for heating the exposed wafer W, post-baking units 46, 47, and the like are, for example, eight tiered from the bottom in order.

A wafer carrier 50 is provided in the center part of the interface section 4. This wafer carrier 50 is structured to be movable in the X direction (in the top and bottom direction in FIG. 1) and the Z direction (the vertical direction), and to be rotatable in a θ direction (a rotating direction around a Z axis), and to be able to get access to the extension and cooling unit 41, the extension unit 42, a peripheral exposure unit 51 and a not-shown exposure unit which belong to the fourth process unit group $G_4$, and to carry the wafer W to each of them.

Figure 4:
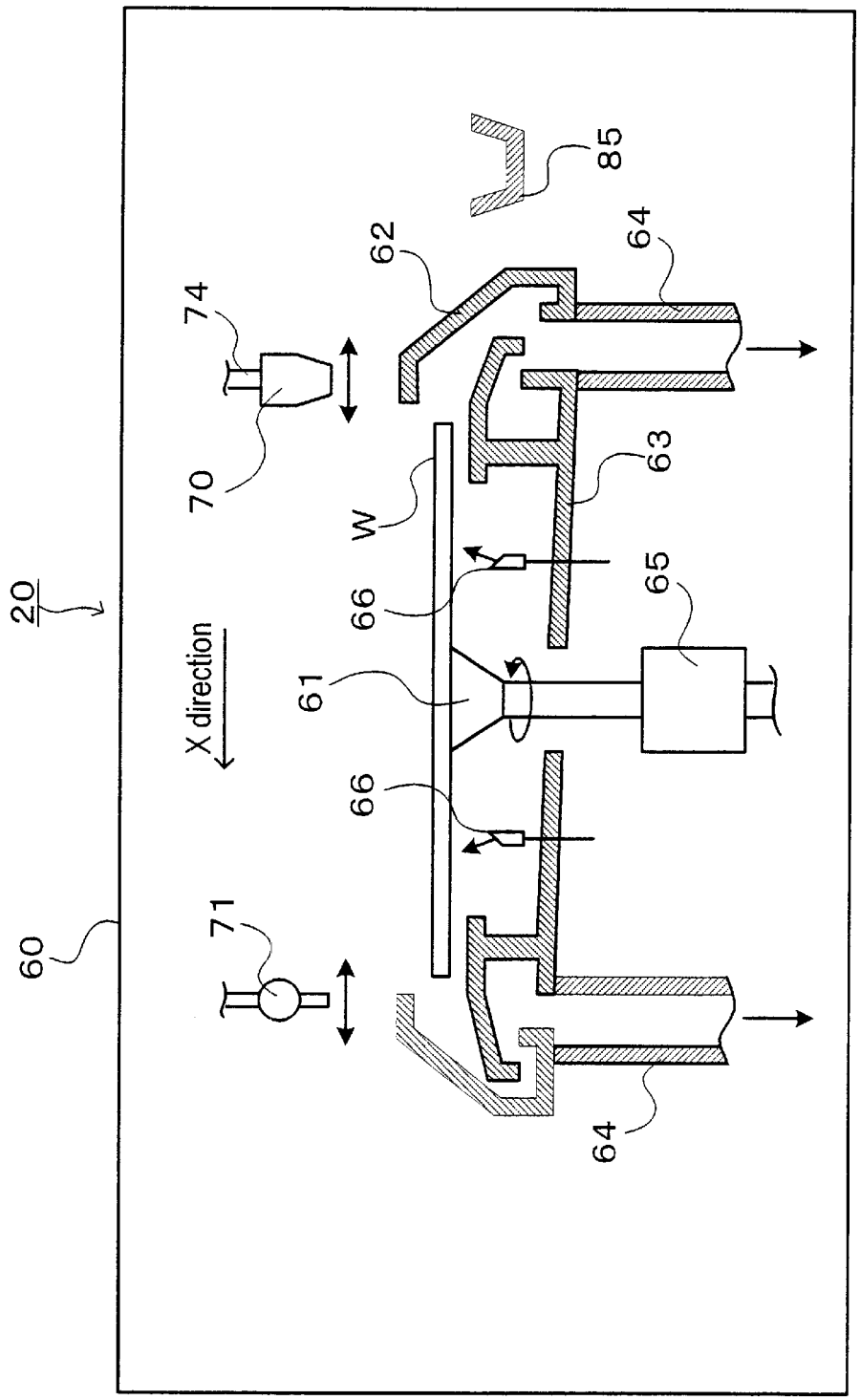
FIG. 4 is an explanatory view of a vertical section of a developing unit used in the first embodiment.

The structure of the aforementioned developing unit 20 will be explained in detail. As shown in FIG. 4, a spin chuck 61 for sucking and mounting the wafer W is provided in the center of a chamber 60 of the developing unit 20. The spin chuck 61 is structured to be rotatable by a rotating mechanism 65 such as a motor which is provided underneath thereof. Further, a cup 62 is provided so as to surround the periphery of the spin chuck 61. The cup 62, having an almost cylindrical shape, is formed to surround the spin chuck 61 with a side surface and a bottom surface thereof, and its upper surface is open. A drainpipe 64 for discharging a developing solution and a washing solution is attached in a bottom surface 63 of the cup 62. Therefore, it is structured so that a process solution scattered from the wafer W by rotating the aforementioned spin chuck 61 is received by the cup 62, and is discharged from the underneath drainpipe 64.

Moreover, a rear surface washing nozzle 66 is provided to supply the washing solution to the rear surface of the wafer W which is held by the spin chuck 61. Incidentally, the bottom surface 63 of the cup 62 is slightly tilted and is structured so that the washing solution which is supplied from the aforementioned rear surface washing nozzle 66 is flowed along the tilted bottom surface 63 into the aforementioned drainpipe 64.

Above the wafer W which is held by the spin chuck 61, a developing solution supply nozzle 70 as a developing solution supply nozzle for supplying the developing solution onto the wafer W and a washing nozzle 71 for supplying the washing solution onto the top surface of the wafer W are provided.

Figure 5:
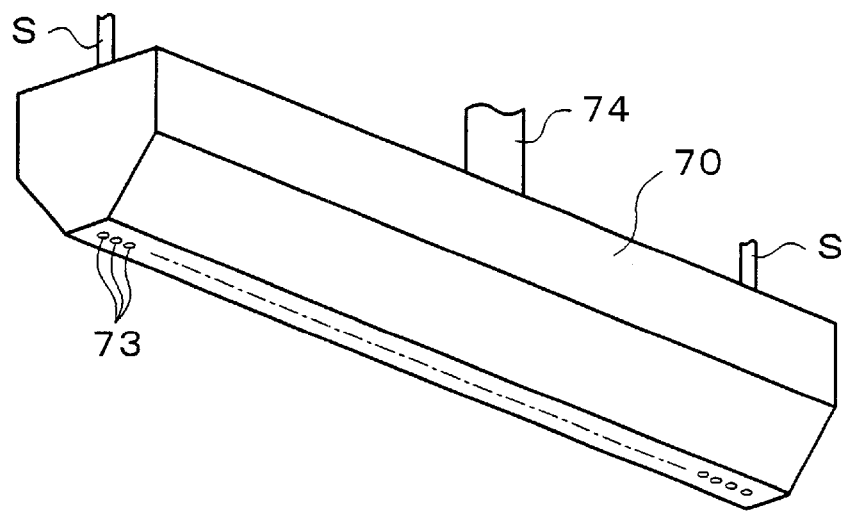
FIG. 5 is a perspective view of a developing solution supply nozzle used in the first embodiment.
Figure 6:
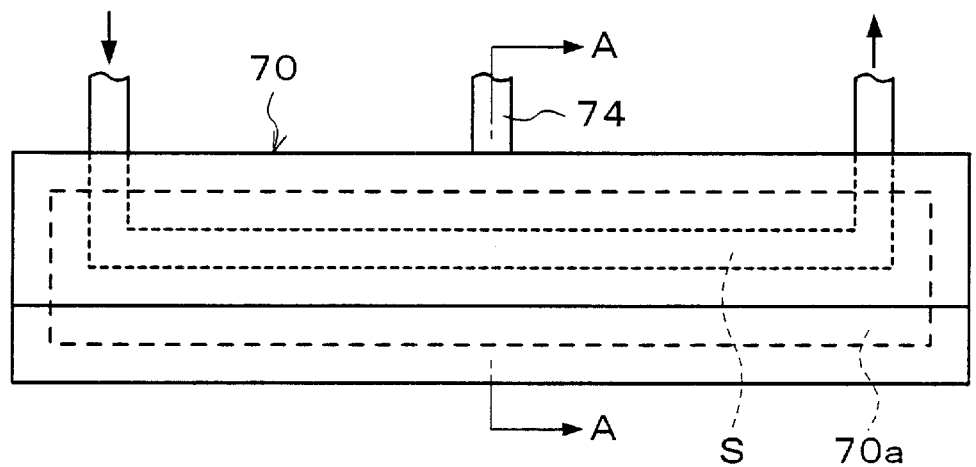
FIG. 6 is a front view of the developing solution supply nozzle used in the first embodiment.
Figure 7:
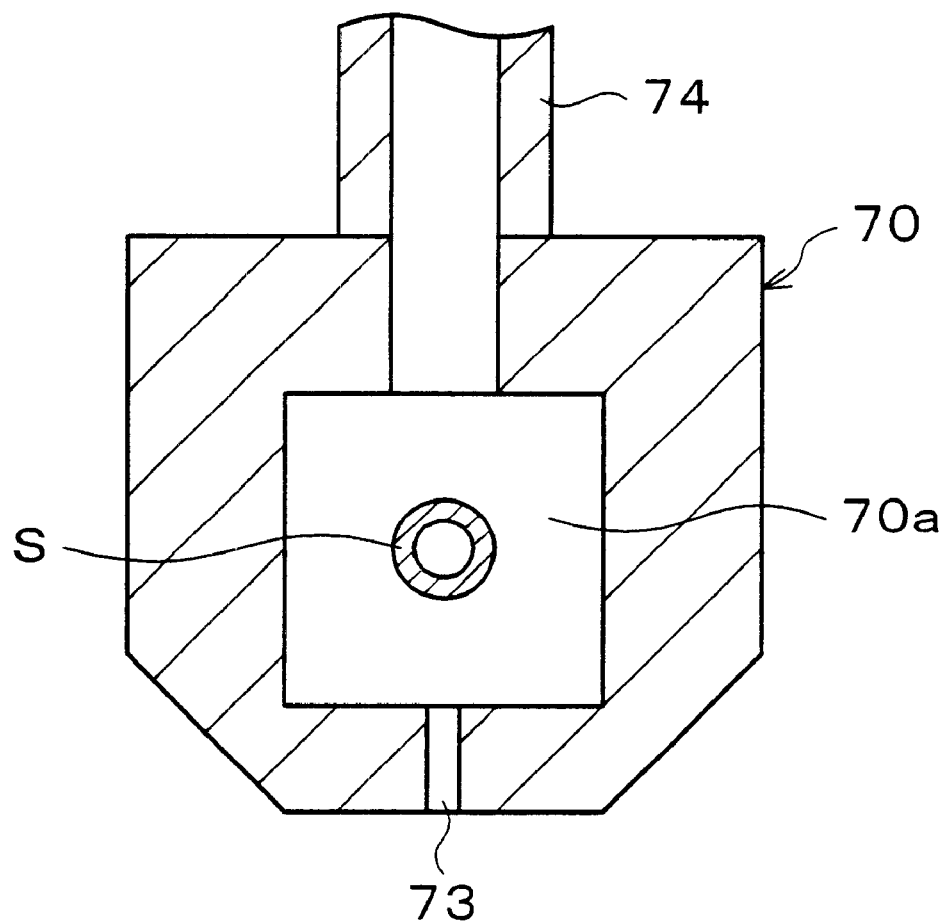
FIG. 7 is an explanatory view of a vertical section of the developing solution supply nozzle used in the first embodiment.

The developing solution supply nozzle 70 is in a slimline shape as shown in FIG. 5 and FIG. 6, and its length is larger than, for example, a diameter of the wafer W. Underneath the developing solution supply nozzle 70, a plurality of developing solution supply holes 73 are provided in a line in a longitudinal direction. Further, above the developing solution supply nozzle 70, a developing solution supply path 74 for supplying the developing solution is provided. The developing solution which is supplied from the developing solution supply path 74 is temporarily stored in a developing solution storage portion 70a provided inside the developing solution supply nozzle 70 as shown in FIG. 7. The developing solution storage portion 70a has a long space in the longitudinal direction, and leads to all of the developing solution supply holes 73. Further, it is structured so that the developing solution is supplied from all the developing solution supply holes 73 onto the wafer W when a predetermined pressure is applied to the aforementioned developing solution storage portion 70a. Therefore, the developing solution is discharged in a straight line which is larger than the diameter of the wafer W by discharging the developing solution of a predetermined amount simultaneously from the plurality of the developing solution supply holes 73, and the developing solvent can be supplied onto the entire surface of the wafer W with one scan by discharging it while moving the developing solution supply nozzle 70 as will be described later.

Further, inside the storage portion 70a, as shown in FIG. 6, a temperature control tube S for controlling the temperature of the developing solution inside the storage portion 70a is provided along the aforementioned longitudinal direction. The temperature control tube S is formed in a tubular shape so that the temperature controlled medium, for example, water controlled to 23° C. flows inside the temperature control tube S. Further, the temperature control tube S can exchange heat between the inside and the outside of the temperature control tube S. The temperature control tube S is formed to enter into the storage portion 70a from above and near one end of the developing solution supply nozzle 73, to flow inside the storage portion 70a which is formed in the longitudinal direction, and to exit from above and near the other end of the developing solution supply nozzle 73 to the outside of the developing solution supply nozzle 73. Thus, the temperature of the developing solution inside the storage portion 70a is controlled by the temperature controlled water flowing through the temperature control tube S. Therefore, the wafer W is developed by the developing solution of a predetermined temperature, thereby enhancing uniformity of line width of a circuit pattern which is finally formed on the wafer W.

Figure 8:
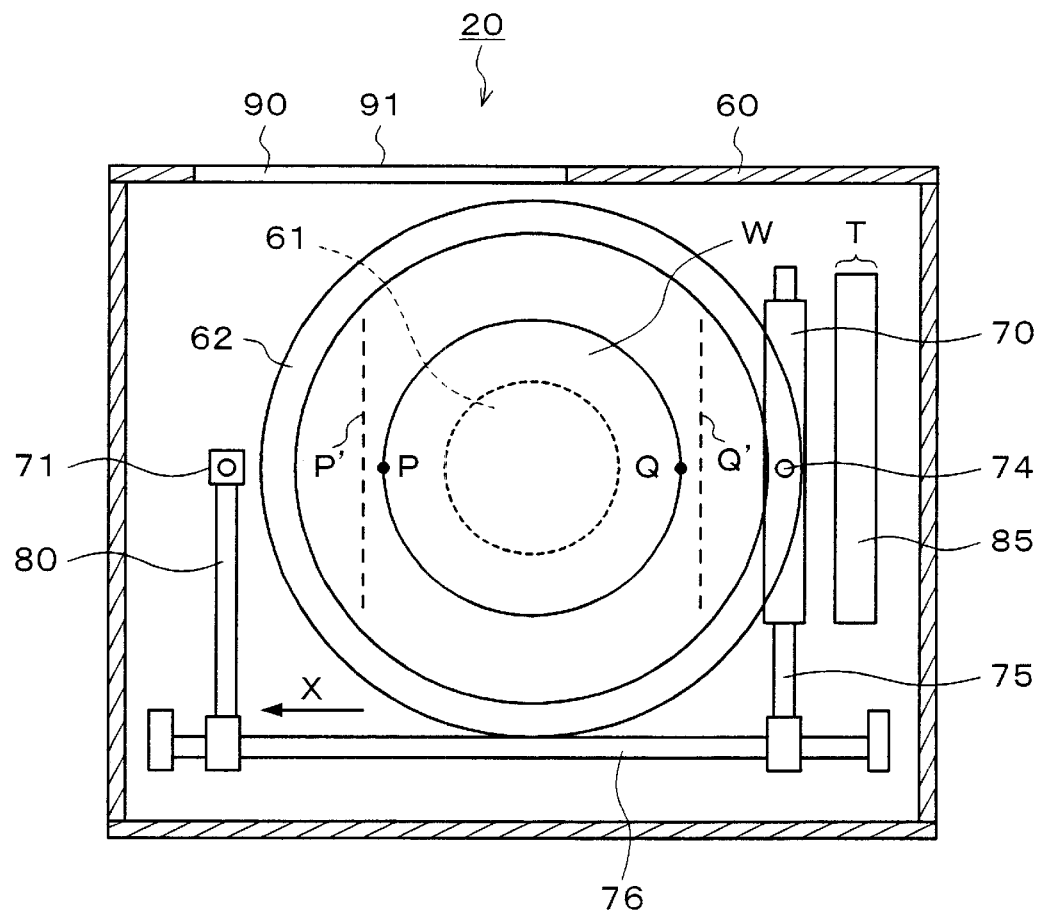
FIG. 8 is an explanatory view of a cross section of the developing unit used in the first embodiment.

The developing solution supply nozzle 70 is held to be hung by an arm 75, as shown in FIG. 8. The arm 75 is structured to be movable along a rail 76 which extends in an X direction (a right and left direction in FIG. 8, the left direction is regarded to as a positive direction) by a not-shown driving mechanism such as a motor. Thus, the developing solution supply nozzle 70 is movable above the wafer W in parallel, which makes it possible to supply the developing solution onto the wafer W while moving in parallel as described above. Incidentally, the arm 75 is also structured to be movable in a vertical direction in order to control a distance between the developing solution supply nozzle 70 and the wafer W.

The aforementioned washing nozzle 71 is held by an arm 80 which is structured to be movable along the rail 76 by a not shown driving mechanism. Therefore, the washing nozzle 71 is movable in the X direction similarly to the developing solution supply nozzle 70. Further, the length of the arm 80 is controlled so that the washing nozzle 71 can be positioned above the center of the wafer W. Thereby, the washing solution which is supplied from the washing nozzle 71 can be supplied onto the wafer W evenly when the wafer W is washed by spinning with the spin chuck 61.

As shown in FIG. 4 and FIG. 8, a washing tank 85 for washing the developing solution supply nozzle 70 is provided at a standby position T of the developing solution supply nozzle 70 outside the cup 62. A section of the washing tank 85 is formed in a concave shape in order to receive the slimline developing solution supply nozzle 70, and a predetermined solvent for washing the developing solution adhered to the developing solution supply nozzle 70 is stored inside the washing tank 85.

It should be noted that, as shown in FIG. 8, a carrier opening 90 which carries in/out the wafer W by the carrier unit 13 and a shutter 91 which freely opens/closes the carrier opening 90 are provided in the chamber 60, and the carrier opening 90 is shifted from the center of the chamber 60 toward the other developing unit 18 side, that is, toward the positive direction in the X direction because the carrier arm 13a of the carrier unit 13 approaches to the chamber 60 from a slanting direction, as is clear from the plane view of the coating and developing system 1 in FIG. 1.

Next, an operation of thus-structured developing unit 20 will be explained with a process of photolithography which is operated in the coating and developing system 1.

First, the wafer carrier 7 removes one wafer W which is not processed from the cassette C and carries it into the adhesion unit 31 which belongs to the third process unit group $G_3$. The wafer W, coated with an adhesion reinforcing agent such as HMDS for enhancing an adhesion property with the resist solution in the adhesion unit 31, is carried into the cooling unit 30 by the main carrier unit 13 to be cooled to a predetermined temperature. Thereafter, the wafer W is carried to the resist coating unit 17 or 19 and the prebaking unit 34 or 35 in due order to be processed in a predetermined manner. Then, the wafer W is carried into the extension and cooling unit 41.

Subsequently, the wafer W is removed from the extension and cooling unit 41 by the wafer carrier 50 to be carried into the exposure unit (not shown) through the peripheral exposure unit 51. The exposed wafer W is carried into the extension unit 42 by the wafer carrier 50 to be held by the main carrier unit 13. Then, the wafer W is carried into the post-exposure baking unit 44 or 45 and the cooling unit 43 in due order to be processed in a predetermined manner in these process units, and carried into the developing unit 18 or 20.

Further, the developed wafer W is carried into the post-baking unit 35 and the cooling unit 30 by the main carrier unit 13 in order. Thereafter, the wafer W is returned to the cassette C through the extension unit 32 by the wafer carrier 7, and a series of the predetermined coating and developing operations is complete.

In explaining the operation of the aforementioned developing unit 20 in detail with reference to FIG. 8, the wafer W which is first cooled to a predetermined temperature in the cooling unit 43 is carried into the chamber 60 through the carrier opening 90 to be mounted on the spin chuck 61 by the carrier arm 13a of the main carrier unit 13. Next, the developing solution supply nozzle 70 which is on standby inside the washing tank 85 at the standby position T of the developing solution supply nozzle 70 rises from the washing tank 85.

Subsequently, the developing solution supply nozzle 70 which is held by the arm 75 moves toward the positive direction in the X direction by the not-shown driving mechanism, passes above the wafer W, and stops at P' which is a position slightly advanced from the end part P of the positive direction side in the X direction of the wafer W inside the cup 62. Here, the developing solution supply nozzle 70 only moves without supplying the developing solvent, and the developing solution supply nozzle 70 does not drip the developing solution onto the wafer W since it is just out from the washing tank 85.

Next, the developing solution supply nozzle 70 lowers to a predetermined distance in order to control the distance between the developing solution supply holes 73 of the developing solution supply nozzle 70 and the wafer W. Then, the developing solution is supplied from the developing solution supply path 74 into the developing solution supply nozzle 70, and the discharge of the developing solution is started from the plurality of the developing solution supply holes 73. At the same time, the developing solution supply nozzle 70 starts to move from the position P' toward a negative direction in the X direction, and supplies the developing solution while moving above the wafer W. As described above, the length of the developing solution supply nozzle 70 in the longitudinal direction is larger than the diameter of the wafer W and the developing solution is simultaneously supplied from the plurality of the developing solution supply holes 73 which are provided underneath the nozzle 70, so that the developing solution is supplied onto the entire surface of the wafer W when the developing solution supply nozzle 70 reaches the other end part Q of the negative direction in the X direction of the wafer W.

The developing solution supply nozzle 70 stops at Q' which is a position slightly advanced from the other end part Q and rises again. Thereafter, it moves further toward the negative position in the X direction and stops temporarily when it comes above the washing tank 85. Then, it is put into the washing tank 85 in which the solvent is stored to be washed, which will be on standby until the next wafer W is carried into.

The wafer W is placed as it is for a predetermined time from the developing solution is supplied in a state of rest to be developed. After the developing, the washing nozzle 71 moves along the rail 76 by the not-shown driving mechanism and stops above the center of the wafer W. Then, the wafer W on the spin chuck 61 is rotated quickly by the rotating mechanism 65 and pure water as the washing solution is supplied onto the top surface and rear surface of the wafer W respectively from the washing nozzle 71 and the rear surface washing nozzle 66 to wash the developing solvent on the surface of the wafer W. Thereafter, pure water is stopped from supplying, and the wafer W is rotated more quickly to be dried.

After a series of the developing operations, the wafer W is carried out from the carriage opening 90 by the carrier arm 13a of the carrier unit 13 to be carried into the post-baking unit 35 for the next process.

According to the above embodiment, in a series of the reciprocating movements of the developing solution supply nozzle 70 above the wafer W, the developing solution is not supplied when the developing solution supply nozzle 70 moves from the washing tank 85 which is the standby position T to the position P' which is outside the end portion of the wafer W (forward movement), and the developing solution is supplied only when it moves from the position P' to the position Q' which is outside the other end portion of the wafer W (backward movement). The developing solution is supplied only in the forward movement conventionally and hence there is a possibility that the developing solution is dripped from the developing solution supply nozzle 70 onto the wafer W during the backward movement, but this possibility can be eliminated. For this reason, harmful effects due to the drip of the developing solution, for example, developing defect, line width defect and so on can be prevented.

In the aforementioned embodiment, the developing solution supply nozzle 70 reciprocates to supply the developing solvent after the wafer W is carried into the chamber 60 and is mounted on the spin chuck 61, but the wafer W may be carried thereinto after the forward movement and before the backward movement of the developing solution supply nozzle 70.

Figure 9:
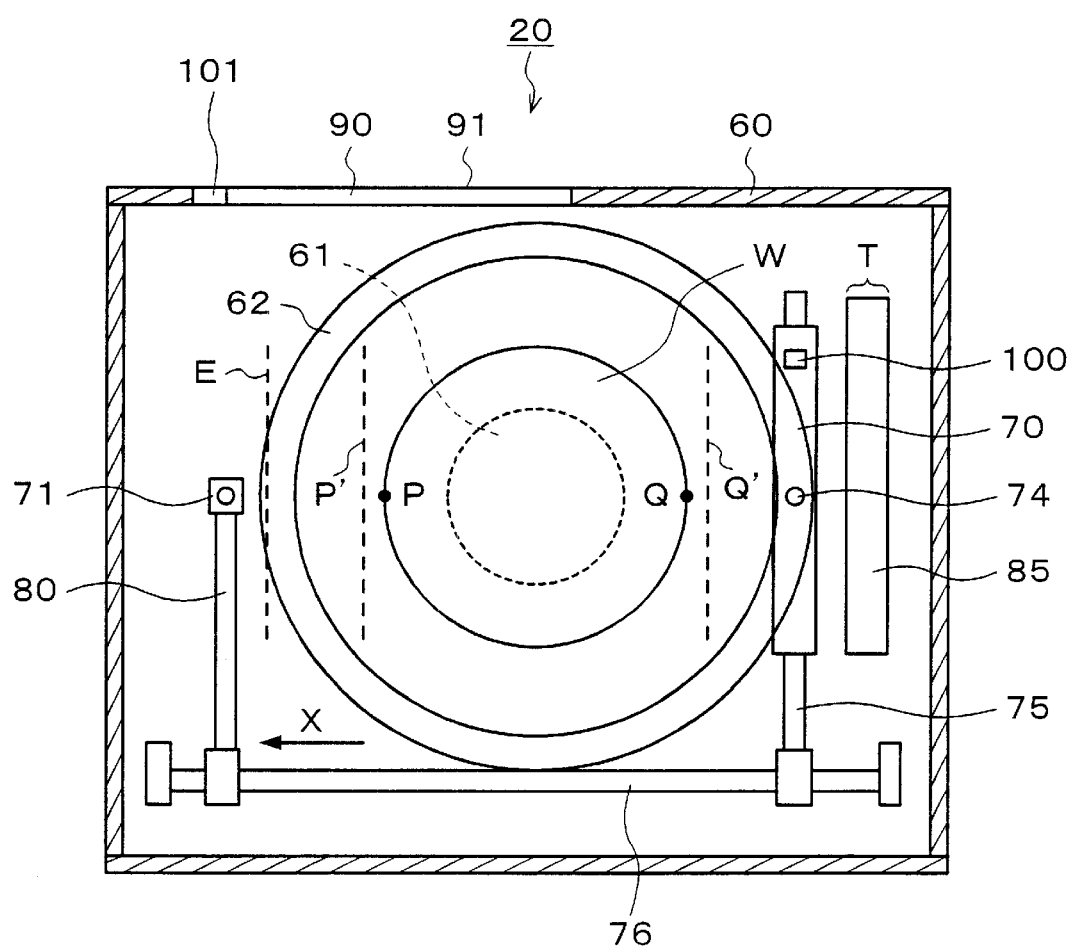
FIG. 9 is an explanatory view of a cross section of the developing unit having a sensor used for controlling an entering and an escaping of an wafer into/out of the developing unit.

On this occasion, it is preferable to separately provide a means for verifying completion of the forward movement of the developing solution supply nozzle 70, for example, an appropriate sensor, and a means for verifying that the carrier arm 13a of the carrier unit 13 escapes from the inside of the chamber 60, in order to prevent an interference between the carrier arm 13a of the carrier unit 13 and the developing solvent supply nozzle 70. For example, as shown in FIG. 9, above the arm 75 holding the developing solution supply nozzle 70, a first sensor 100 for detecting that it is moved to a predetermined position E is provided. The predetermined position E is the position where the developing solution supply nozzle 70 and the carrier arm 13a entering into the chamber 60 do not contact each other. Further, a second sensor 101 is provided in the carrier opening 90 for detecting that the carrier arm 13a escapes from the inside of the chamber 60. Then, these sensors 100, 101 are connected to a not-shown controlling unit which controls to open and close the shutter 91, or the like. As this result, the shutter 91 is opened when the developing solution supply nozzle 70 is moved to the predetermined position E, and the carrier arm 13a can be entered into the chamber 60. Meanwhile, the shutter 91 is closed when the carrier arm 13a escapes from the inside of the chamber, and the reciprocating movements of the developing solution supply nozzle 70 can be started.

Therefore, as the process of the developing, the developing solution supply nozzle 70 is first moved from the washing tank 85 toward the positive direction in the X direction, similarly to the above embodiment.

Next, the first sensor 100 which detects that the developing solution supply nozzle 70 is moved to the position E sends a signal via the not-shown controlling unit to the shutter 91, and the shutter 91 is opened by this signal. Then, the wafer W is carried into the chamber 60 by the carrier arm 13a of the main carrier unit 13 to be mounted on the spin chuck 61. After mounting the wafer W, the carrier arm 13a escapes from the inside of the chamber 60, and the second sensor 101 which detects that the transfer arm 13a completely escapes from the carrier opening 90 sends a signal to the not-shown controlling unit. Then, the shutter 91 is closed by the controlling unit, and concurrently, the driving unit of the developing solution supply nozzle 70 is operated to start the backward movement of the developing solution supply nozzle 70 from the position E toward the negative direction in the X direction. Thereafter, it supplies the developing solution onto the wafer W and moves to the washing tank 85, similarly to the above embodiment.

Thus, by carrying in the wafer W after the so-called backward movement, the developing solution supply nozzle 70 never passes above the wafer W except when supplying the developing solution. Therefore, the possibility that the developing solution is dripped from the developing solution supply nozzle 70 onto the wafer W is eliminated. Further, by the detection of the first sensor 100 and the second sensor 101, the timing of the carrier arm 13a for entering into the chamber 60 and the timing of the developing solution supply nozzle 70 for starting the reciprocating movements can be controlled to prevent the interference between the developing solution supply nozzle 70 and the carrier arm 13a. Incidentally, the aforementioned timing is controlled by using the first sensor 100 and the second sensor 102, but the timing can be controlled by an electric signal, for example, by making the shutter 91 ON based on the electric signal which stops the developing solution supply nozzle 70 by the not-shown controlling unit at the position E to make the developing solution supply nozzle 70 OFF. Further, by using a delay in time, it is also suitable to, for example, set the shutter 91 to open after a predetermined time from the start of the movement of the developing solution supply nozzle 70.

Figure 10:
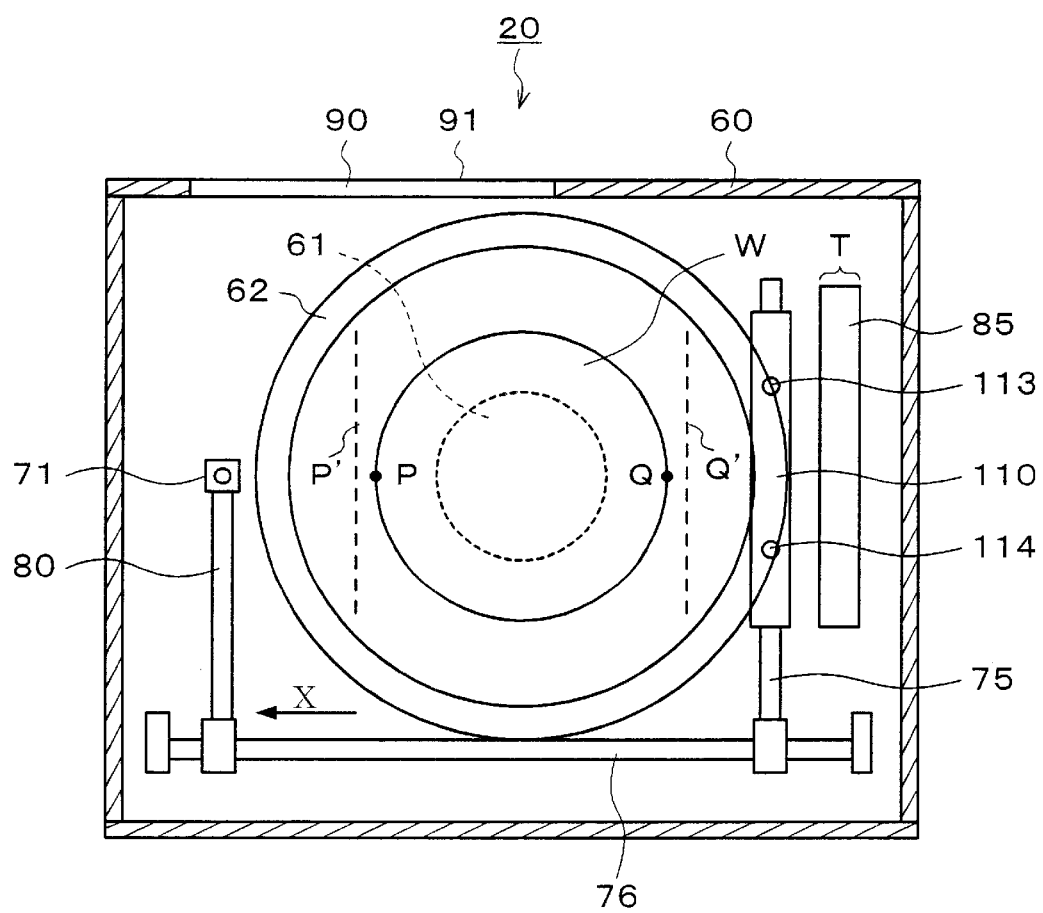
FIG. 10 is an explanatory view of a cross section of the developing unit used in the second embodiment.

Next, as a second embodiment, an example in which, before supplying a developing solution, pure water is supplied onto a wafer W to form a pure water film onto the wafer W, and then the developing solution is supplied will be explained. In this second embodiment, as shown in FIG. 10, the entire structure of a developing unit 20 and a moving mechanism of a developing solution supply nozzle and the like are the same with those of the first embodiment, but the structure of a developing solution supply nozzle 110 is different therefrom because pure water is also supplied. This developing solution supply nozzle 110 is in a slimline shape as shown in FIG. 11 and FIG. 12, and its length in a longitudinal direction is larger than, at least, a diameter of the wafer W.

Figure 13:
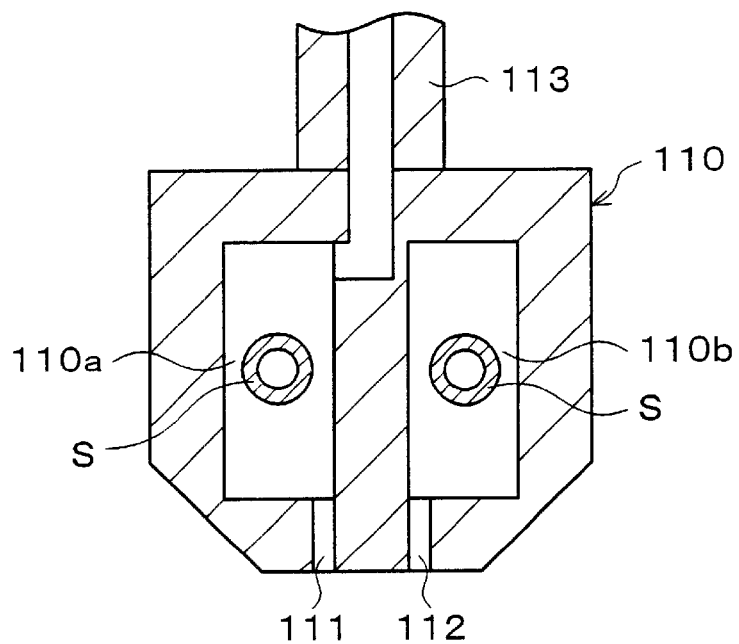
FIG. 13 is an explanatory view of the developing solution supply nozzle used in the second embodiment, showing a section taken along the A—A line shown in FIG. 12.
Figure 14:
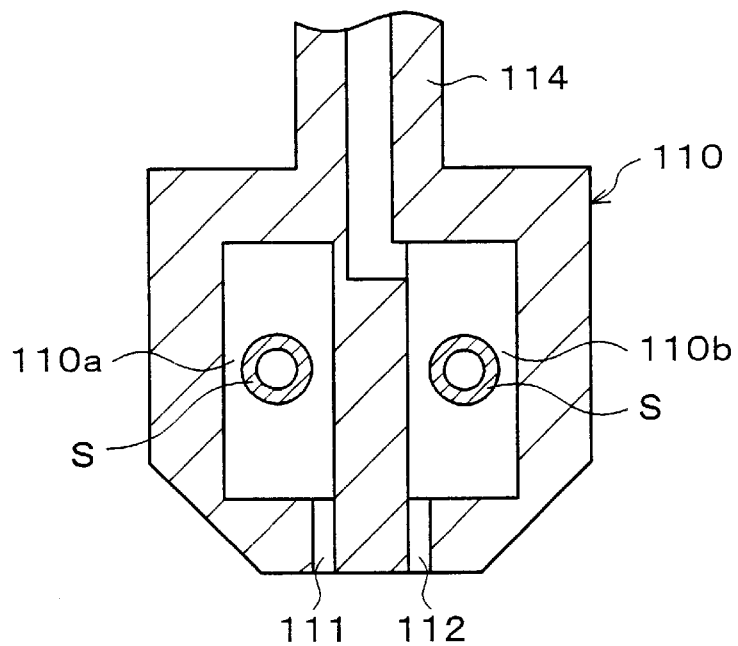
FIG. 14 is an explanatory view of the developing solution supply nozzle used in the second embodiment, showing a section taken along the B—B line shown in FIG. 12.

Further, underneath the developing solution supply nozzle 110, a plurality of developing solution supply holes 111 and a plurality of pure water supply holes 112 are provided respectively in a line in the longitudinal direction. Above the developing solution supply nozzle 110, a developing solution supply path 113 for supplying the developing solution and a pure water supply path 114 for supplying pure water are respectively provided. Inside the developing solution supply nozzle 110, as shown in FIG. 13 and FIG. 14, a developing solution storage portion 110a for temporarily storing the developing solution from the developing solution supply path 113 and a pure water storage portion 110b for temporarily storing pure water from the pure water supply path 114 are separately provided. The developing solution storage portion 110a and the pure water storage portion 110b have long spaces in the longitudinal direction of the developing solution supply nozzle 110, and the developing solution storage portion 110a leads to all of the developing solution supply holes 111 and the pure water storage portion 110b leads to all of the pure water supply holes 112. Therefore, the developing solution supplied from the developing solution supply path 113 is temporarily stored in the developing solution storage portion 110a and subsequently, discharged from the plurality of the developing solution supply holes 111. Further, pure water supplied from the pure water supply path 114 is temporarily stored in the pure water storage portion 110b and subsequently, discharged from the plurality of the pure water supply holes 112.

Moreover, inside the developing solution storage portion 110a and inside the pure water storage portion 110b, similarly to the first embodiment, temperature control tubes S are respectively provided for controlling the temperature of the developing solution and pure water separately. Therefore, the temperature of the wafer W can be prevented from varying when pure water is supplied onto the wafer W, and thereafter, the developing solution controlled to a predetermined temperature can be supplied onto the wafer W.

Figure 11:
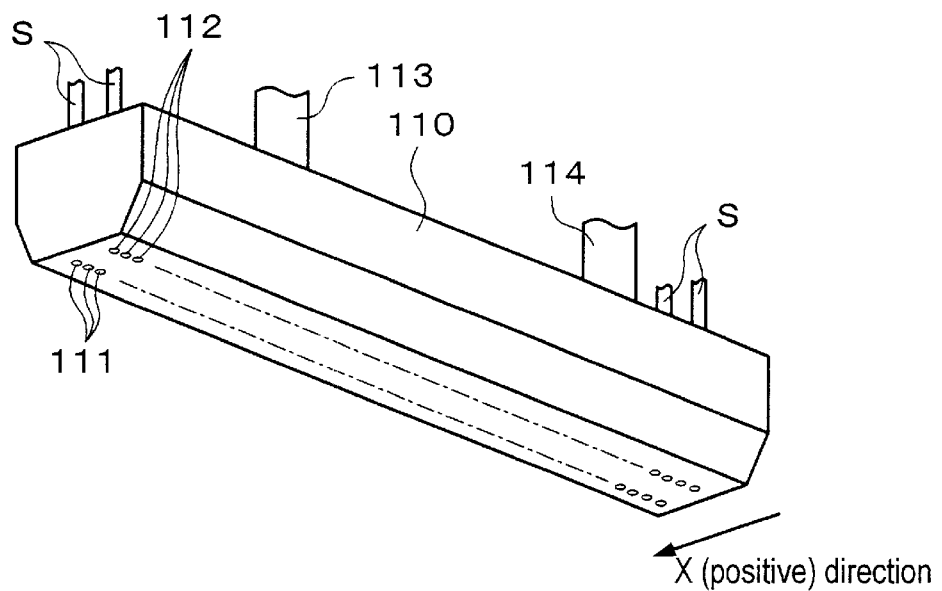
FIG. 11 is a perspective view of the developing solution supply nozzle used in the second embodiment.
Figure 12:
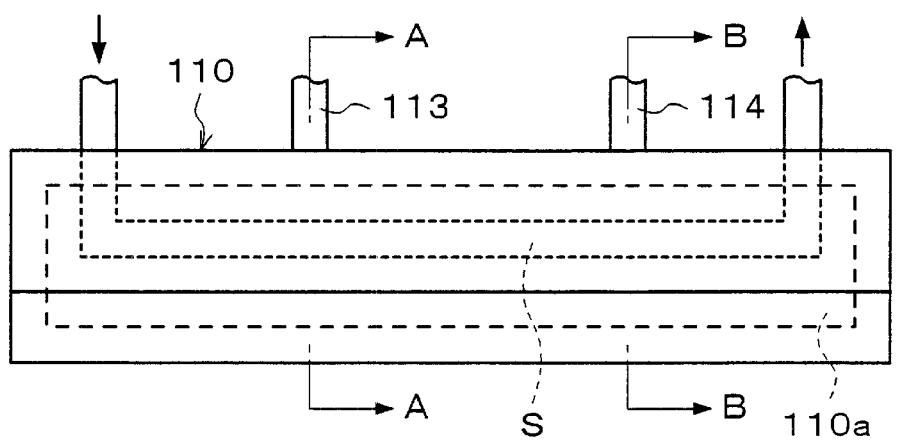
FIG. 12 is a front view of the developing solution supply nozzle used in the second embodiment.

Regarding the aforementioned developing solution supply holes 111 and the pure water supply holes 112, as shown in FIG. 11, the developing solution supply holes 111 are provided in a positive direction side in an X direction of the developing solution supply nozzle 110, and the pure water supply holes 112 are provided in a negative direction side in the X direction thereof. Thus, the supply holes for supplying a process solution always makes the rear side of the moving direction in order to supply pure water when the developing solution supply nozzle 110 moves toward the positive direction in the X direction and to supply the developing solution when it moves toward the negative position in the X direction, which will be described later.

Next, a process of the developing according to the second embodiment will be explained with reference to FIG. 10, FIG. 15 and FIG. 16. Similarly to the first embodiment, the wafer W is first mounted onto a spin chuck 61, and then the developing solution supply nozzle 110 which is on standby in a washing tank 85 moves toward the positive direction in the X direction. Thereafter, it stops temporarily at Q' as a position slightly advanced from an other end part Q which is the negative direction side in the X direction of the wafer W toward the washing tank 85 side inside a cup 62. Then, it lowers in order to control a distance between the wafer W and the pure water supply holes 112.

Figure 15:
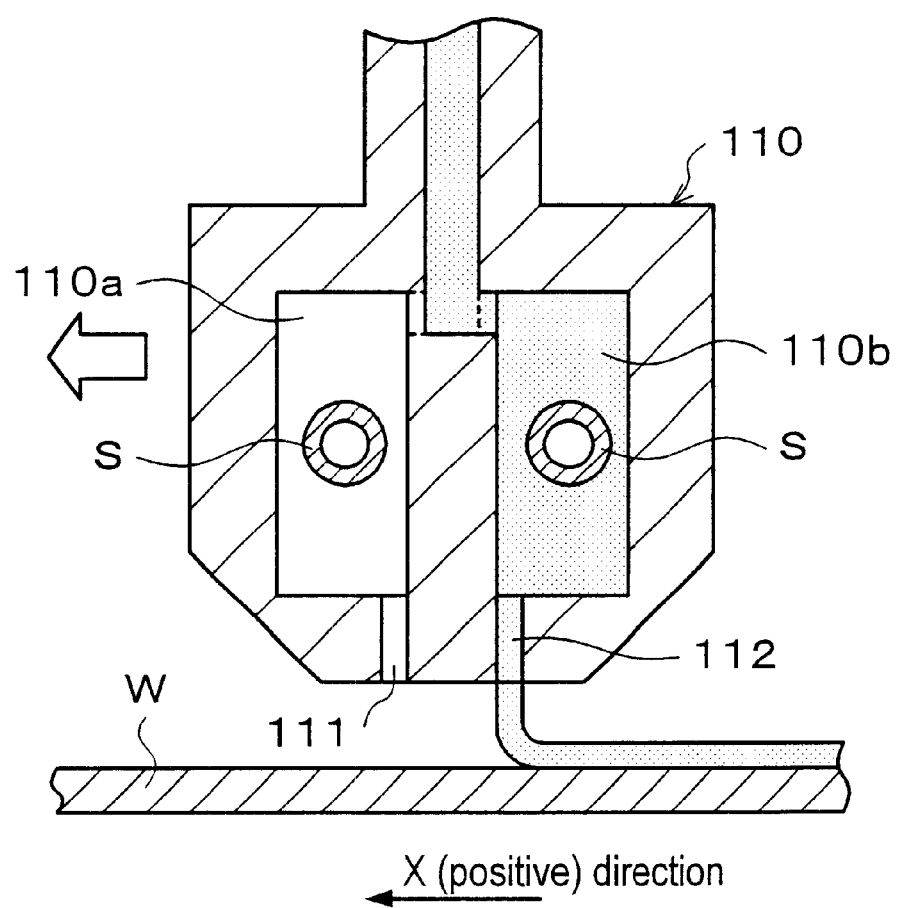
FIG. 15 is an explanatory view of the developing solution supply nozzle used in the second embodiment, when moving toward a positive direction in an X direction and supplying pure water from a pure water supplying hole onto the wafer.
Figure 16:
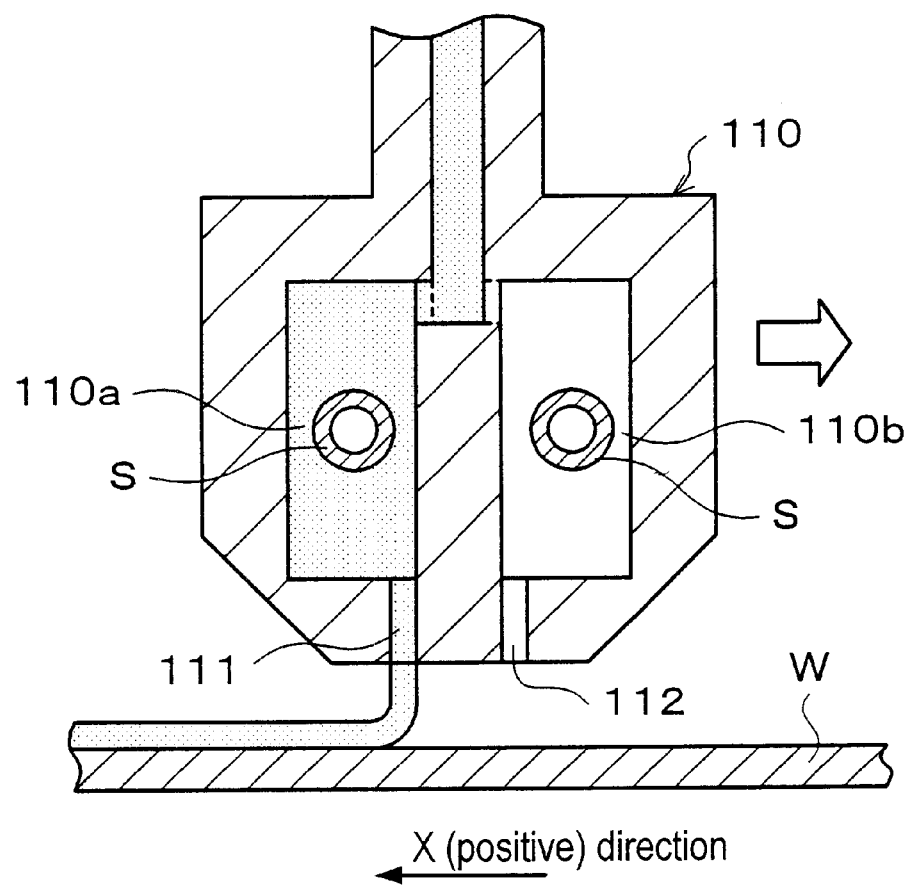
FIG. 16 is an explanatory view of the developing solution supply nozzle used in the second embodiment, when moving toward a negative direction in the X direction and supplying the developing solution from the developing solution supplying hole onto the wafer.

Subsequently, as shown in FIG. 15, it moves toward the positive direction in the X direction again, and supplies pure water onto the wafer W while moving. Then, it stops at P' which is a position slightly advanced from the end part P of the positive direction side in the X direction of the wafer W. At this time, the pure water film is formed on the surface of the wafer W. Next, as shown in FIG. 16, the developing solution supply nozzle 110 moves toward the negative direction in the X direction, and the developing solution is supplied from the developing solution supply holes 111. The developing solution supply nozzle 110 stops when it moves to the position Q' which is the position outside the end portion Q of the wafer W. Thereafter, the developing solution supply nozzle 110 is raised and returned back to the washing tank 85 to be subjected to the washing. Similarly to the first embodiment, after the wafer W is developed for a predetermined time, the wafer W is washed by a washing nozzle 71, dried, and carried out by the carrier arm 13a.

According to the aforementioned second embodiment, in a series of the reciprocating movements of the developing solution supply nozzle 110, pure water is supplied from the pure water supply holes 112 onto the wafer W in the forward movement, and the developing solution is supplied from the developing solution supply holes 111 onto the wafer W in the backward movement. Therefore, there is no possibility that the developing solution is dripped from the developing solution supply nozzle 110 during the reciprocating movements of the developing solution supply nozzle 110. Further, pure water is supplied onto the wafer W to form the pure water film before supplying the developing solvent, which makes it possible to prevent minute air bubbles which exist in the developing solution and minute air bubbles which is generated when the developing solution contacts with the wafer W from adhering to the wafer W. Therefore, developing defect such as partial unevenness of the developing can be retarded. Moreover, the developing solution supply holes 111 are provided in the positive direction side in the X direction and the pure water supply holes 112 are provided in the negative direction side in the X direction, so that contamination of the respective supplying holes can be prevented because the process solution is always discharged from the supply holes in the rear side of the moving direction.

Figure 17:
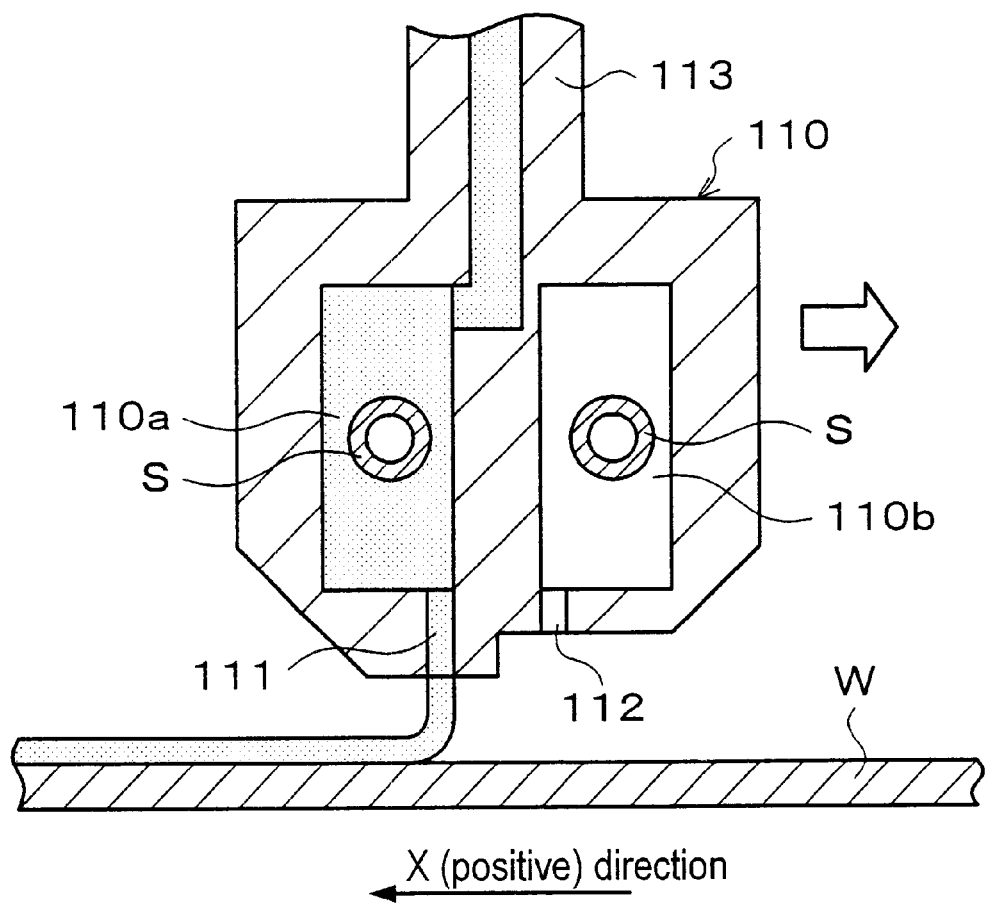
FIG. 17 is an explanatory view of the developing solution supply nozzle in which a position of the pure water supply hole is higher than that of a developing solution supply hole, when moving and supplying the developing solution onto the wafer.

Regarding the aforementioned developing solution supply nozzle 110, as shown in FIG. 17, the position of the pure water supply holes 112 can be higher than the position of the developing solution supply holes 111. Thereby, contamination of the pure water supply holes 112 by the developing solution can be securely prevented in supplying the developing solution.

Figure 18:
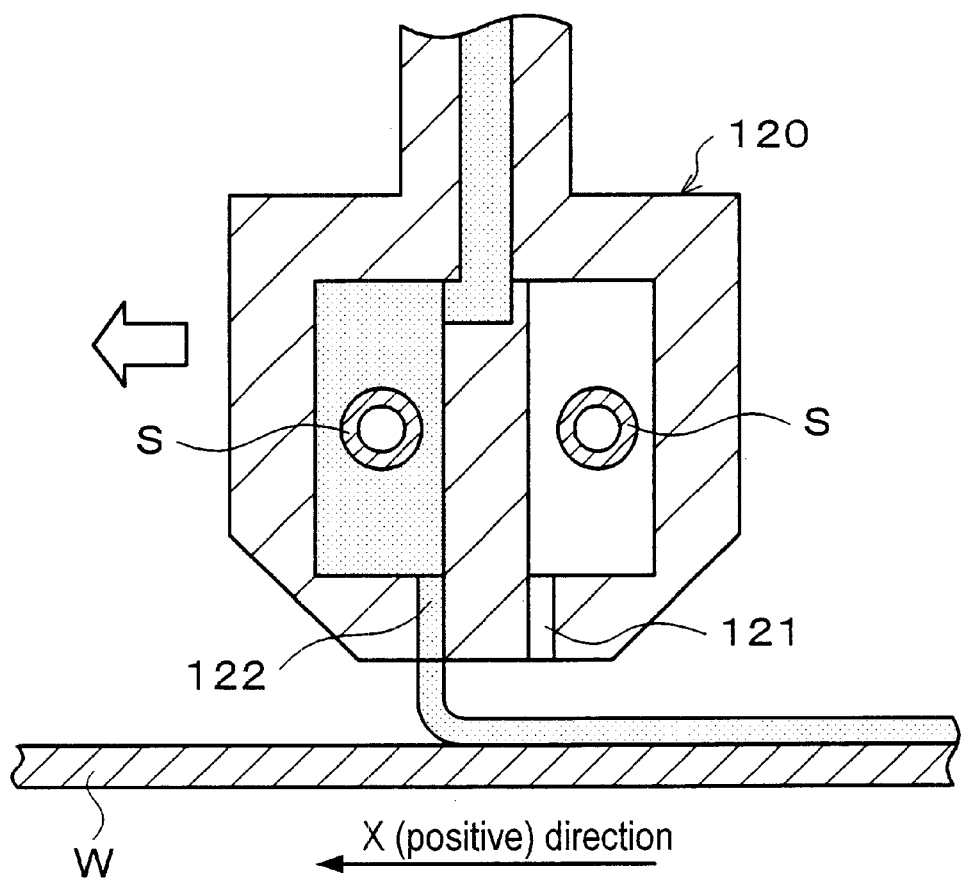
FIG. 18 is an explanatory view of the developing solution supply nozzle in which the position of the pure water supply hole is higher than that of the developing solution supply hole, when moving and supplying pure water onto the wafer.
Figure 19:
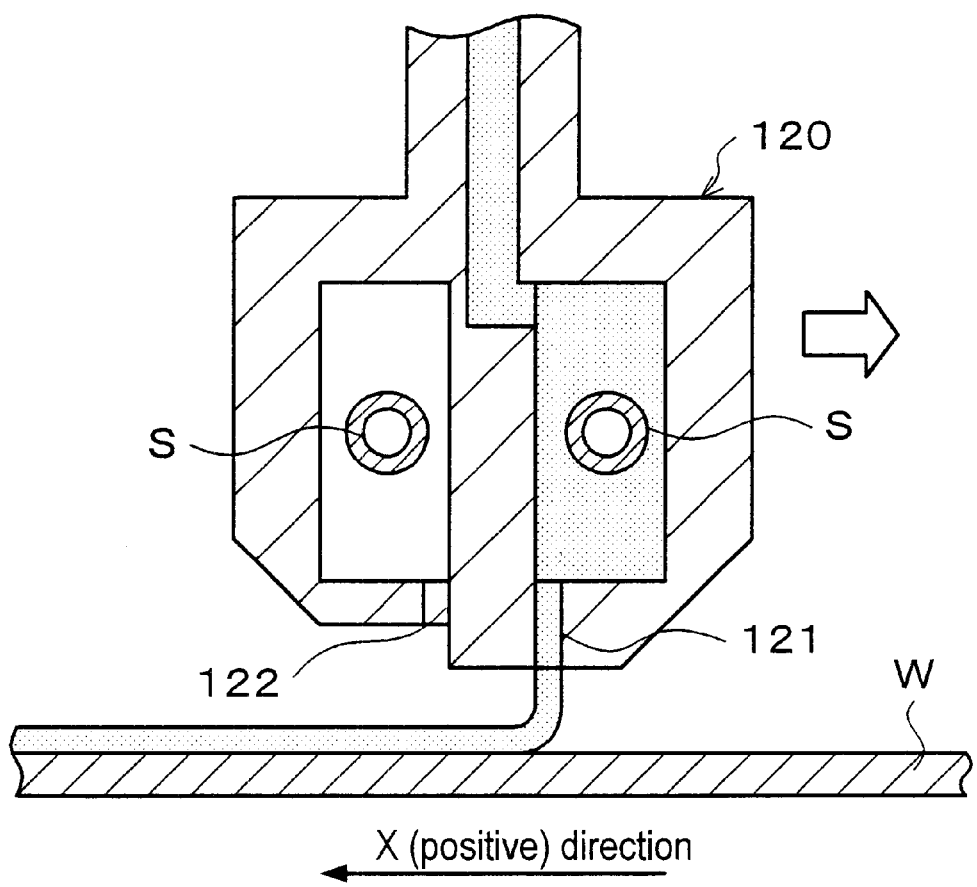
FIG. 19 is an explanatory view of the developing solution supply nozzle in which the position of the pure water supply hole is higher than that of the developing solution supply hole, when moving and supplying the developing solution onto the wafer.

In the aforementioned second embodiment, the developing solution supply holes 111 are provided in the positive direction side in the X direction and the pure water supply holes 112 are provided in the negative direction side in the X direction, which can be reversed as shown in FIG. 18, and developing solution supply holes 121 can be provided in the negative direction side in the X direction of a developing solution supply nozzle 120 and pure water supply holes 122 can be provided in the positive direction side of the X direction. Thereby, in the forward movement while moving toward the positive direction in the X direction and supplying pure water, the developing solution supply holes 121 always passes above the pure water film of the wafer W, so that there is no harmful effects on the developing of the wafer W because the pure water film is already formed thereon, even if the developing solution is dripped from the developing solution supply holes 121. Incidentally, as shown in FIG. 19, the position of the pure water supply holes 122 can be higher than the position of the developing solution supply holes 121, thereby preventing contamination of the pure water supply holes 112 by the developing solution.

In the aforementioned embodiment, one washing tank 85 for washing the developing solution supply nozzle is provided in the negative direction side in the X direction with respect to the wafer W, but it can be provided at both sides with the wafer W therebetween. Thereby, the developing solution supply nozzle can be washed every time when the developing solution supply nozzle passes from one end of the wafer W above the wafer W to the other end of the wafer W, so that the developing solution never drips onto the wafer W.

Figure 20:
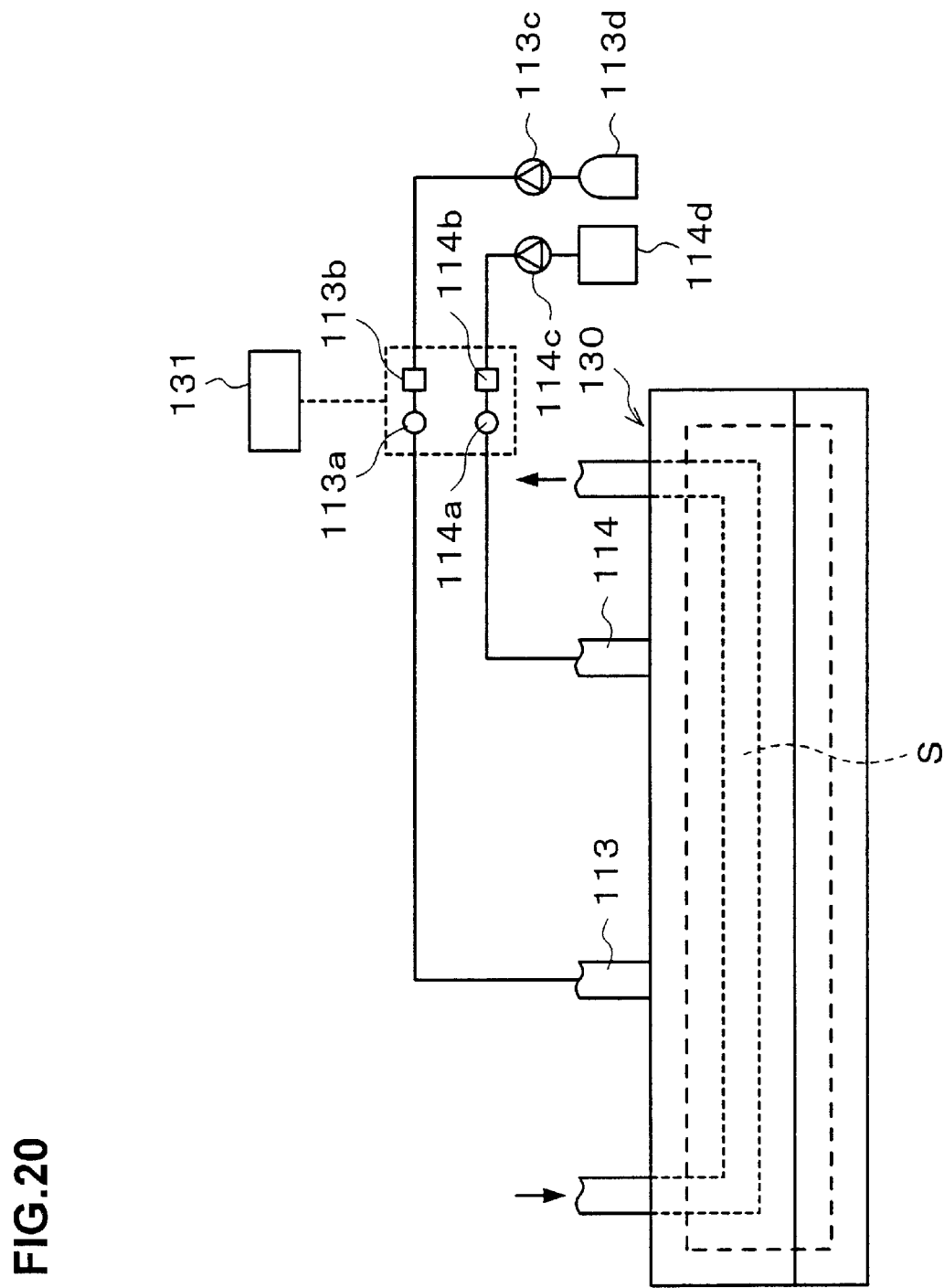
FIG. 20 is a front view of another developing solution supply nozzle.

Next, an example of the developing solution supply nozzle will be explained. As shown in FIG. 20, a developing solution supply nozzle 130 has the same structure with that of the aforementioned developing solution supply nozzle 110, but as shown in FIG. 21, it can simultaneously supply the developing solution from a developing solution storage portion 110a and pure water from a pure water storage portion 110b.

As shown in FIG. 20, a developing solution supply path 113 leads to a developing solution supply source 113d through a valve 113a, a mass flow controller 113b and a pump 113c. Meanwhile a pure water supply path 114 leads to a pure water supply source 114d through a valve 114a, a mass flow controller 114b and a pump 114c. These valves 113a, 114a and the mass flow controllers 113b, 114b are controlled by a controlling unit 131.

Figure 21:
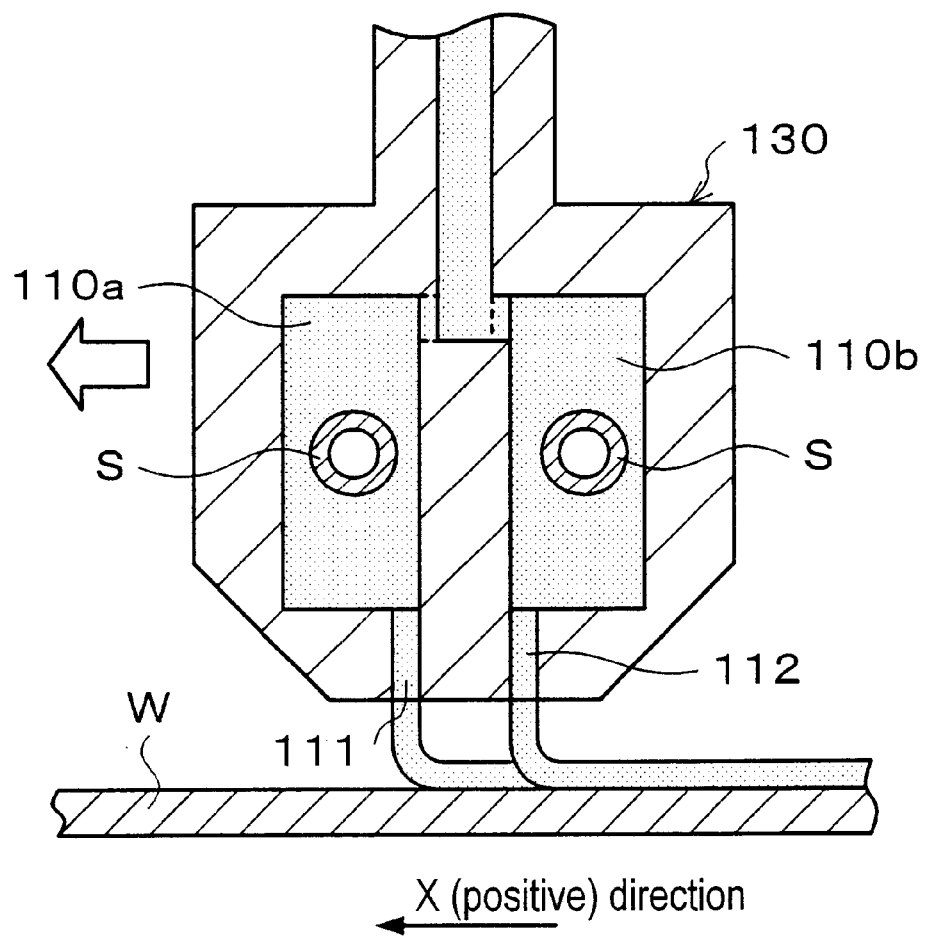
FIG. 21 is an explanatory view of the developing solution supply nozzle in FIG. 21 while in use.

According to the developing solution supply nozzle 130, as shown in FIG. 21, the developing solution and pure water can be supplied onto the wafer W at the same time. Therefore, when, for example, operating the normal developing, the developing solution is first supplied from developing solution supply holes 111 onto the wafer W and the wafer W is placed as it is for a predetermined time in a state of rest to be developed. After the developing, as shown in FIG. 21, the developing solution and pure water are simultaneously supplied onto the wafer W while rotating the wafer W so that the developing solution with a low concentration is supplied onto the wafer W. Thereby, the occurrence of so-called pH shock can be prevented.

Thereafter, for example, the supplying amount of the developing solution is gradually decreased and the supplying amount of pure water is increased to the same amount. Thus, the developing solution with the decreasing concentrations is gradually supplied onto the wafer W. Finally, the supplying of the developing solution is stopped and only pure water is supplied onto the wafer W, which makes it possible to wash the developing solution from the wafer W.

The decreasing of the concentration of the developing solution like this can be operated in a step-by-step manner or in a continuous manner. Whichever the case may be, this kind of change of the concentration of the developing solution can be realized by controlling the valves 113a, 114a and the mass flow controllers 113b, 114b by the controlling unit 131.

Figure 22:
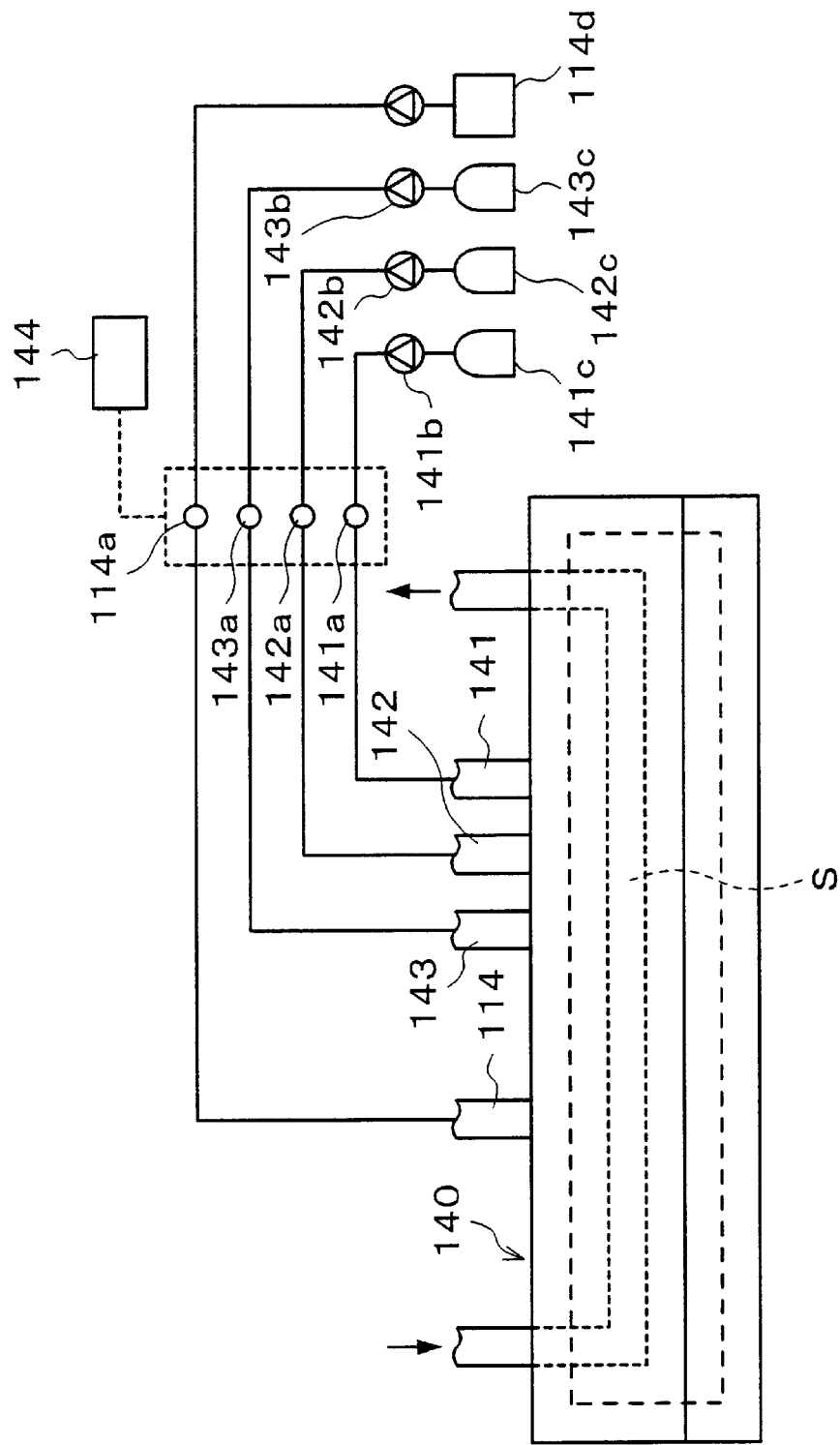
FIG. 22 is a front view of a developing solution supply nozzle having a plurality of developing solution supply lines with different concentrations.

In the above example, a supply line of the developing solution is one line of the developing solution supply path 113, but a plurality of the supply lines of the developing solution can be equipped as shown in FIG. 22. A developing solution supply nozzle 140 in FIG. 22 includes three developing solution supply paths 141, 142, 143, and the respective paths lead to predetermined developing solution supply sources 141c, 142c, 143c through corresponding valves 141a, 142a, 143a and pumps 141b, 142b, 143b. The developing solutions with different concentrations are respectively prepared in the developing solution supply sources 141c, 142c, 143c. In this example, the developing solution prepared for the developing solution supply source 141c contains the highest concentration, and the developing solutions are prepared for the developing solution supply source 142c, the developing solution supply source 143c in decreasing order of the concentrations.

Further, a controlling unit 144 controls all of the valve 114a of the pure water supply path, the valves 141a, 142a, 143a of the developing solution supply path 141 by switching.

According to thus-structured developing solution supply nozzle 140, when, for example, operating the normal developing, the developing solution is first supplied from developing solution supply path 141 onto the wafer W and the wafer W is placed as it is for a predetermined time in a state of rest to be developed. After the developing, the developing solution containing the low concentration is supplied onto the wafer W from the developing solution supply path 142 while rotating the wafer W, so that the occurrence of the so-called pH shock can be prevented. Next, the supply line of the developing solution is switched to supply the developing solution containing the lower concentration onto the wafer W from the developing solution supply path 143, and finally the supplying of the developing solution is stopped and pure water is supplied onto the wafer W from the pure water path 114, which makes it possible to remove the developing solution from the wafer W. The switching of the developing solutions with different concentrations and the switching to the supplying of pure water can be realized by controlling the valves 141a, 142a, 143a and the valve 114a by the controlling unit 144.

Incidentally, the washing nozzle 71 can have a function which is the same with those of the aforementioned developing solution supply nozzles 130, 140, and can be structured so that the developing solutions with the decreasing concentrations, other than pure water, can be gradually supplied therefrom.

The above explained embodiment is about the developing method of the wafer W in the process of photolithography in a fabricating process of a semiconductor wafer device, but the present invention is also applicable to a developing method of substrates other than the semiconductor wafer, such as an LCD substrate.

What is claimed is:

1. A method for developing a substrate by supplying a developing solution from a developing solution supply nozzle onto a surface of the substrate mounted on a predetermined position, comprising the steps of:
   moving the developing solution supply nozzle from a standby position of the developing solution supply nozzle outside one end of the substrate to at least the other end of the substrate without supplying the developing solution; and
   moving the developing solution supply nozzle thereafter from the other end to at least the one end while supplying the developing solution.

2. A method for developing a substrate by supplying a developing solution from a developing solution supply nozzle onto a surface of the substrate mounted on a predetermined position, comprising the step of:
   mounting the substrate on the predetermined position, between the steps of:
      moving the developing solution supply nozzle from a standby position of the developing solution supply nozzle outside a predetermined position to at least the other end of the substrate without supplying the developing solution; and
      moving the developing solution supply nozzle thereafter from the other end to at least one end while supplying the developing solution.

3. A method as set forth in claim 2, wherein said step of mounting on the predetermined position is operated by a carrier unit for carrying the substrate, wherein the carrier unit enters the predetermined position after completion of said step of moving the developing solution supply nozzle from the standby position to at least the other end without supplying the developing solution is verified, and wherein said step of moving the developing solution supply nozzle from at least the other end to at least the one end while supplying the developing solution is operated after completion of an escape of the carrier unit from the predetermined position is verified.

4. A method for developing a substrate by supplying a developing solution from a developing solution supply nozzle onto a surface of the substrate mounted on a predetermined position, comprising the steps of:

moving the developing solution supply nozzle from a standby position of the developing solution supply nozzle outside one end of the substrate to at least the other end of the substrate while supplying pure water; and moving the developing solution supply nozzle thereafter from at least the other end to at least the one end while supplying the developing solution.

5. A developing unit of a substrate for supplying a developing solution onto the substrate with a developing solution supply nozzle moving toward a predetermined direction above the substrate, wherein the developing solution supply nozzle includes a developing solution supply hole for supplying the developing solution and a pure water supply hole for supplying pure water individually along the predetermined direction, and wherein the pure water supply hole is structured to supply pure water when moving to a reverse direction of the predetermined direction, and the pure water supply hole is placed in a forward side of a moving direction in supplying pure water.

6. A developing unit as set forth in claim 5, wherein a position of the pure water supply hole is provided to be higher than that of the developing solution supply hole.

7. A developing unit of a substrate for supplying a developing solution onto the substrate with a developing solution supply nozzle moving toward a predetermined direction above the substrate, wherein the developing solution supply nozzle includes a developing solution supply hole for supplying the developing solution and a pure water supply hole for supplying pure water individually along the predetermined direction, and wherein the pure water supply hole is structured to supply pure water when moving to a reverse direction of the predetermined direction, and the pure water supply hole is placed in a backward side of a moving direction in supplying pure water.

8. A developing unit as set forth in claim 7, wherein a position of the pure water supply hole is provided to be higher than that of the developing solution supply hole.

9. A developing unit of a substrate including a developing solution supply nozzle for moving above the substrate and for supplying a developing solution onto the substrate, comprising:

washing tanks for washing the developing solution supply nozzle outside both ends of the substrate, respectively.

10. A developing unit of a substrate for supplying a developing solution onto the substrate with a developing solution supply nozzle moving toward a predetermined direction above the substrate, wherein the developing solution supply nozzle includes a developing solution supply hole for supplying the developing solution and a pure water supply hole for supplying pure water individually along the predetermined direction, and wherein a supplying amount of the developing solution from the developing solution supply hole and a supplying amount of pure water from the pure water supply hole are adjustable.

11. A developing unit of a substrate for supplying a developing solution onto the substrate with a developing solution supply nozzle moving toward a predetermined direction above the substrate, wherein the developing solution supply nozzle includes a developing solution supply hole for supplying the developing solution and a pure water supply hole for supplying pure water individually along the predetermined direction, and wherein the developing solution supply hole is structured to be able to supply the developing solutions with a plurality of different concentrations.

* * * * *